Figure 1:
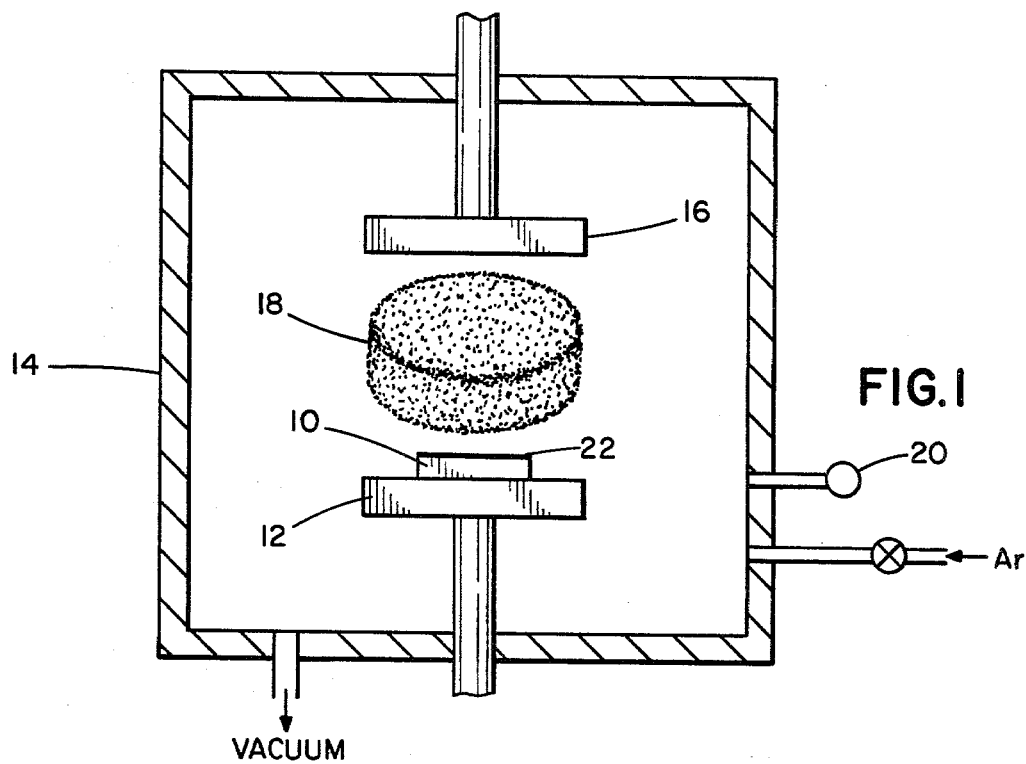

United States Patent [19]

Perepezko et al.

[11] 4,350,994
[45] Sep. 21, 1982

[54] SEMICONDUCTOR DEVICE HAVING AN AMORPHOUS METAL LAYER CONTACT

[75] Inventors: John H. Perepezko; John D. Wiley, both of Madison, Wis.

[73] Assignee: Wisconsin Alumni Research Foundation, Madison, Wis.

[21] Appl. No.: 81,859

[22] Filed: Oct. 4, 1979

[51] Int. Cl.³ .................. H01L 23/48; H01L 29/46; H01L 29/62
[52] U.S. Cl. ........................ 357/67; 357/65; 357/68; 357/71; 357/2
[58] Field of Search ............. 357/65, 67, 68, 71, 357/2

[56] References Cited

U.S. PATENT DOCUMENTS

| | | | |
|---|---|---|---|
| 3,582,324 | 6/1971 | Kunert et al. | 357/67 |
| 3,607,240 | 9/1971 | Kunert et al. | 357/67 |
| 3,664,874 | 5/1972 | Epstein | 357/67 |
| 3,675,090 | 7/1972 | Neale | 357/2 |
| 3,746,944 | 7/1973 | Naraoka et al. | 357/67 |
| 3,877,049 | 4/1975 | Buckley | 357/67 |
| 3,886,577 | 5/1975 | Buckley | 357/71 |
| 4,177,475 | 12/1979 | Holmberg | 357/2 |
| 4,181,913 | 1/1980 | Thornburg | 357/67 |
| 4,224,115 | 9/1980 | Nara et al. | 357/67 |

*Primary Examiner*—Andrew J. James
*Attorney, Agent, or Firm*—McDougall, Hersh & Scott

[57] ABSTRACT

Ohmic contacts for high temperature semiconductor devices comprising a layer strongly bonded to the surface of the semiconductor in the form of an alloy of a metal in the amorphous state in which the metal is a transition metal or a refractory metal having a recrystallization temperature from the amorphous state in excess of 200° C.

10 Claims, 2 Drawing Figures

SEMICONDUCTOR DEVICE HAVING AN AMORPHOUS METAL LAYER CONTACT

This invention relates generally to improved metallization systems for semiconductors or devices and integrated circuits and more particularly to contacts, such as ohmic contacts, for high temperature semiconductor devices, and to methods and compositions for use in the manufacture of same.

There are many important applications in which it would be highly desirable to have electrical transducers, discrete semiconductor devices, or complete circuits capable of sustained operation at elevated temperatures such as at temperatures up to 500° C. and above. Such applications include in-situ monitoring of jet engines, internal combustion engines, turbines, nuclear reactors, geothermal holes, and "hot" oil wells. The high temperatures and often corrosive environments encountered in these applications present extremely difficult reliability and lifetime problems which are not being met with existing semiconductor devices or technologies. Particularly severe are the problems of hermetic packaging; internal device passivation; and metallurgical problems associated with the formation of Ohmic contacts to the semiconductor, metal interconnects, and bonded lead wires.

The crucial step in developing reliable high temperature devices of the type described is believed to be that of isolating a semiconductor which is capable of functioning at elevated temperatures, and a metallization system that is compatible with the semiconductor during high temperature operation. Compatibility requires: (1) that the chosen metal or metals exhibit good adhesion to the semiconductor, (2) acceptable morphological and mechanical properties at the operating temperatures, (3) that the selected metal/semiconductor system be capable of producing good Ohmic (non-blocking or non-injecting) characteristics with minimal specific contact resistance at the operating temperatures, and (4) that the overall system be stable in its electrical and mechanical properties for periods of at least several thousand hours at the operating temperatures.

In the design and fabrication of semiconductor devices and integrated circuits, metals are used to perform at least four separate functions, namely (1) to form Ohmic contacts to the semiconductor; (2) to form rectifying or Schottky contacts to the semiconductor; (3) to form interconnects; and (4) to form gate metallizations in MOS devices.

The physical properties demanded of the metal are slightly different in each case, so that no one elemental metal or alloy is optimum for all four functions. The search for appropriate metals for functions (1) and (2) is largely empirical, there being no way to predict, a priori, whether a given metal will form good quality Ohmic or Schottky contacts with a given semiconductor. Function (3) requires that the metal have a high electrical to minimize I$^2$R losses and parasitic resistances. For function (4), high conductivity is less important than the metal's work function (which plays a role in determining the MOS threshold voltage). In addition to these considerations, the choice of an appropriate metallization should take account of practical constraints imposed by processing and reliability considerations.

Such practical constraints include such processing constraints as (a) compatability with practical deposition methods; (b) compatability with standard patterning techniques; (c) compatability with standard wire bonding techniques; (d) good adhesion to the semiconductor and passivating layers; and (e) compatability with thermal cycling. Such reliability constraints include (f) good edge definition and line-width control; (g) good thermal conductivity; (h) resistance to electromigration; (i) resistance to interdiffusion or reaction with substrates; and (j) resistance to formation of intermetallic compounds.

The constraints, combined with the basic functional requirements, place severe restrictions on the choice of metallization. In practice, some of the constraints require conflicting properties, e.g. reactivity vs. inertness, making it difficult to find a single, simple metallization which will suffice for all functions. This often leads to the use of multi-component or multilayer metallizations with various different metals serving as adhesion layers, diffusion barriers, bonding or capping layers, etc. During processing, the metal layers are often exposed to high temperatures and, during operation, they may be exposed to moderately elevated temperatures, temperature gradients and high current densities. These environmental conditions serve to accelerate diffusion and chemical reactions among most metal, semiconductor, and insulating materials leading, in many cases, to the formation of unwanted compounds which cause device failure for electrical or mechanical reasons.

From the consideratin of the required semiconductor characteristics, such as intrinsic carrier concentration, it is clear that compounds such as GaAs and GaP are among the most attractive candidates for high-temperature applications up to 500° C. While present technology can be used to produce satisfactory Ohmic contacts to GaAs and GaP, these methods are not capable of being applied to high temperature devices.

Most metals, when deposited onto a substrate by sputtering, evaporation, or plating, produce films having a polycrystalline microstructure. This is true of all metals and alloys currently used in semiconductor devices and integrated circuit metallizations. During pattern delineation, the grain boundaries often etch preferentially, leading to poor edge definition and poor line-width control. It has been found that the best edge resolution is obtained with fine-grained metals. As the grain size is reduced, however, grain-boundary diffusion becomes increasingly troublesome and all processes controlled by diffusive transport, such as phase separation, compound formation, etc., are enhanced. Electromigration, a very severe problem occurring at high current density ($J \gtrsim 10^4 A/cm^2$), is also enhanced along grain boundaries. As a result, among conventional metallizations, those films which afford the highest pattern resolution pose the most severe reliability problems due to grain-boundary diffusion and electromigration.

It is believed that simple metallization systems using the minimum number of component overlayers have the best chance for success in achieving high-temperature stability over long durations. A prime requirement for high stability of a contact overlayer is resistance to interdiffusion reactions, which implies an overlayer component that is effectively a diffusion barrier. To satisfy this requirement, the overlayer material that is used should have a high kinetic resistance to any change or modification of its atomic structural state at the working temperature of the device.

This invention takes novel and unique approach to this problem by making use of the characteristic of some metal and alloy systems to undergo a vitrification to a compositionally homogeneous amorphous phase.

The macroscopic manifestation of the transition from liquid to glass is a homogeneous and continuous hardening, as measured by the shear viscosity, with decreasing temperature. Accompanying the hardening are changes in physical properties, such as abrupt decreases in heat capacity and thermal expansion coefficients which are related to the inability of the material to achieve configurational equilibrium during the time of observation in the high-viscosity regime. Changes in atomic configuration in liquids scale roughly as the shear viscosity. At a viscosity of $10^{13}$ P, the time constant, $\tau_c$, for configurational adjustment is of the order of 0.5 hr and increases to about one day at a viscosity of $10^{15}$ P. In most experiments, the onset of the glass transition occurs at a viscosity of about $10^{13}$ P, which is taken as an operational definition of the glass-transition temperature ($T_g$). From a microscopic view, the distinction between an amorphous solid and a crystalline solid is clearer. The equilibrium atomic positions in a crystalline solid are correlated over many atomic spacings. In an amorphous solid, diffraction examination has demonstrated that any translational correlations in the equilibrium position of the constitutent atoms do not extend beyond distances of a few atomic diameters.

The limit of metastability of a highly-undercooled liquid is marked by the onset of a homogeneous nucleation of the crystalline state unless the glass transition intervenes at a temperature above the nucleation temperature. For metals and metallic alloys, the onset of homogeneous nucleation has been taken to occur at an undercooling equivalent to 0.2 $T_m$, where $T_m$ is the absolute melting temperature. Recent work has demonstrated that many liquid metals and alloys may be undercooled to a significantly greater extent than 0.2 $T_m$. In some cases, undercoolings approaching 0.5 $T_m$ may be attained in carefully prepared samples. While such findings are important in extending the range of liquid undercooling, which is accessible to study, they also serve to emphasize that most solidification reactions occur as result of the heterogeneous catalysis of nucleation.

The crystallization of a liquid at large undercoolings of 100° C. or more is a very rapid process involving the propagation of a solidification front at velocities of the order of cm/sec. However, the reaction is thermally activated so that not only is it necessary for sufficient driving force to be present, but also adequate atomic mobility must be available. Therefore, the extent and occurrence of crystallization may be limited if a liquid can be undercooled rapidly to a low temperature where atomic mobility is sluggish. This is the basis of the most commonly used techniques for generating the amorphous state in metallic systems.

While many of the early investigations of glass formation in metallic alloys involved the use of the "splat cooling" technique in which a small amount of liquid is chilled rapidly by impingement on a substrate at high velocity, it is recognized that the cooling rates with this procedure are in the range from about $10^5$ to $10^8$ °K/sec. Basically, "splat cooling" is limited by the rate of heat conduction between the small liquid sample and the underlying substrate. More effective cooling is possible by employing an atomic deposition approach, as represented by sputter deposition in which atoms impinge on a solid surface and are condensed continuously to form a film. Cooling during vapor deposition is determined by the time required for an individual atom to lose its initial kinetic energy to achieve thermal equilibrium with the substrate. The equilibration time for a vapor deposited atom is of the order of $10^{-12}$ sec. Thus, for an initial temperature of $1-2 \times 10^3$ K, and a cooling rate of the order of $10^{15}$ °K/sec is anticipated. The ultra-rapid quench rate possible with vapor deposition implies that atoms are effectively frozen in place within a few atom diameters of their point of impingement on the substrate. As a consequence, a greater variety of metallic alloys may be vitrified by such vapor deposition techniques.

An understanding of the factors that tend to be associated with good glass-forming ability is important not only in providing guidance in selecting systems which may be vitrified easily, but also in judging the relative thermal stability of the amorphous phase. Often, a system, which forms a glass readily, is also a system with a relatively high value of $T_g$ and of the reduced glass temperature, $T_g/T_m$. As a consequence, alloy systems which exhibit amorphous phases which are stable at high temperature are also systems with high melting temperatures.

In accordance with the practice of this invention, such amorphous (glassy) metals are used in semiconductor device and integrated circuit metallization applications. Being amorphous, they contain no grain boundaries or macroscopic inhomogeneities which could cause anisotropic or locally enhanced etching. The ultimate limit to edge resolution achievable with glassy metals is set by the sizes of microscopic composition fluctuations ($\approx 10-20$ Å) or voids ($<10$ Å). The absence of grain boundaries also gives excellent protection against electromigration. Diffusive transport is very slow in glassy metals such that they are exceptionally resistant to interdiffusion and compound formation.

There are a number of additional advantages that are associated with the application of amorphous phases as contact materials for high-temperature service. At temperatures below the glass transition temperature, $T_g$, amorphous phases are kinetically stable and resistant to compound formation. The electrical resistivity of amorphous metallic alloys is in the range of about 10–100 $\mu\Omega$ cm which is satisfactory for contact applications. In addition, below $T_g$ the interdiffusion rates between an amorphous overlayer and the underlying crystalline substrate can be anticipated, from structural considerations, to be very sluggish. The amorphous overlayer contact is an effective diffusion barrier. Since $T_g$ has been found to scale with the melting temperature, $T_m$, and range from about 0.4 $T_m$ to 0.6 $T_m$ for many metals, amorphous phase contacts for high-temperature applications requires the use of relatively high melting point metals such as refractory metals. Among the alloys that appear to have suitable thermal stability to remain in the amorphous state at temperatures up to about 500° C. are Nb-Ni and Ta-Ni. For example, in the Nb-Ni system, alloys in the range from about 30 to 85 atomic % Ni deposit an amorphous state upon annealing to temperatures up to about 600° C.

In accordance with the practice of this invention, the metal or alloy is deposited as amorphous material on a semiconductor, for contact capable of being used at high temperature. It is necessary to use, as the contact metal, a metal or alloy which can be deposited as an amorphous or glassy phase and which is characterized by a crystallization temperature considerably higher than the temperature to which the device will be exposed during metal processing, such as annealing, or during use so that the contact layer will remain in the desired amorphous or glassy state.

For this purpose, use can be made of amorphous alloys having a high crystallization temperature from the amorphous state, such as a temperature above 200° C. and preferably above 500° C. Such amorphous metallizations can be produced from various transition metals and transition metal/normal metal alloys or some refractory metals (which include some transition metals) and refractory metal/normal metal alloys. The transition metals and alloys capable of being used to form the amorphous contact, in accordance with the practice of this invention, are selected of the transition metals to the left of the noble metals, copper, silver, and gold in the periodic table of elements.

The invention will be described with reference to the use of binary alloys but it will be understood that use can be made of binary, ternary and more complex alloys which are metastable in the amorphous phase. The description, as related to binary alloys is made primarily for the sake of simplicity.

Representative of such binary systems are Ni-Nb, Ni-Mo, Mo-Si and W-Si, all of which yield high $T_g$ amorphous alloys. By RF sputtering, amorphous films have been produced of Ni-Nb over the composition range, $Ni_{0.85}Nb_{0.15}$ to $Ni_{0.30}Nb_{0.70}$. These films have glass-transition temperatures in the 600° C. range, with the highest $T_g$ occurring for the composition $Ni_{0.65}Nb_{0.35}$.

Use can be made of Ni-Mo alloys within the composition range near $Ni_{0.65}-Mo_{0.35}$ having $T_g$ values of 600°–800° C.

The Mo-Si and W-Si systems are interesting for a number of reasons. Pure Mo or W have often been proposed as good candidates for high-temperature metallizations on both Si and compound semiconductors. Their use has been limited primarily by the interdiffusion and compound-formation problems previously discussed, which problems may be alleviated by the use of amorphous films. The Mo-Si and W-Si phase diagrams are similar, showing compounds $T_5Si_3$, $T_3Si_2$ and $TSi_2$, where T is Mo or W and eutectics at roughly 20% and 60% Si. The eutectic temperatures are all in the 1900–2300° C. range, leading to the expectation of $T_g$ values of about 1000° C.

Ternary compositions are particularly attractive for the formation of Ohmic and metal contracts. The large atomic size and high melting point of HF make it suitable for a ternary addition to increase the stability of binary alloys in the single-phase amorphous state.

Substrate requirements for successful vapor deposition of amorphous metals, in accordance with the practice of this invention, are easily satisfied by almost any crystalline or amorphous acid. Incident metal atoms come to thermal equilibrium with the surface in times characteristic of a few atomic vibrations ($\sim 10^{-12}$ sec). Thus the main requirement is that the substrate surface be at a temperature well below the glass-transition temperature during deposition. This, in turn, requires that the substrate have a thermal conductivity adequate for rapid transfer of the heat-of-condensation to a heat sink. The fact that amorphous metals have been deposited successfully on such notably poor thermal conductors as pyrex leaves little doubt that all common semiconductors will provide adequate heat-sinking and be usable as substrates.

As substrate, use has been made of silicon, GaAs, GaP, silicon oxide, glass and $Al_2O_3$.

Film deposition can be accomplished by sputtering from composite cathodes. Two systems have been used, namely a DC getter-sputtering system and an RF system.

In the DC system, the cathode, anode and plasma are enclosed in a Ni-plated chamber which serves as the "getter" surface. With the substrate protected by a movable shutter, a predeposition sputtering cycle is used to bury any foreign contaminants under a fresh layer of cathode material. The shutter is then opened and a film is deposited on the substrate. Depositions are carried out at an Ar pressure $\lesssim 50$ Torr and a power level $\lesssim 1$ kW. This system has no provision for substrate cooling, but substrate temperatures are typically below 200° C. during deposition. The small cathode size is convenient and economical for experimentation with varying compositions.

The RF system allows very high sputtering rates at relatively low Ar pressures ($\lesssim 5$ Torr) and, owing to the large cathode size, RF sputtering produces much more uniform films than the DC System. Use is made of composite cathodes, such as formed with overlays of second metals on a pure Ni base. Other base cathodes are available for use in the RF systems including Cr, Ti, Al and Si.

Illustration is made in the accompanying drawings of an arrangement for the preparation of a high temperature semiconductor device in which the amorphous layer of a transition metal or alloy is deposited by the practice of RF sputtering.

Figure 2:
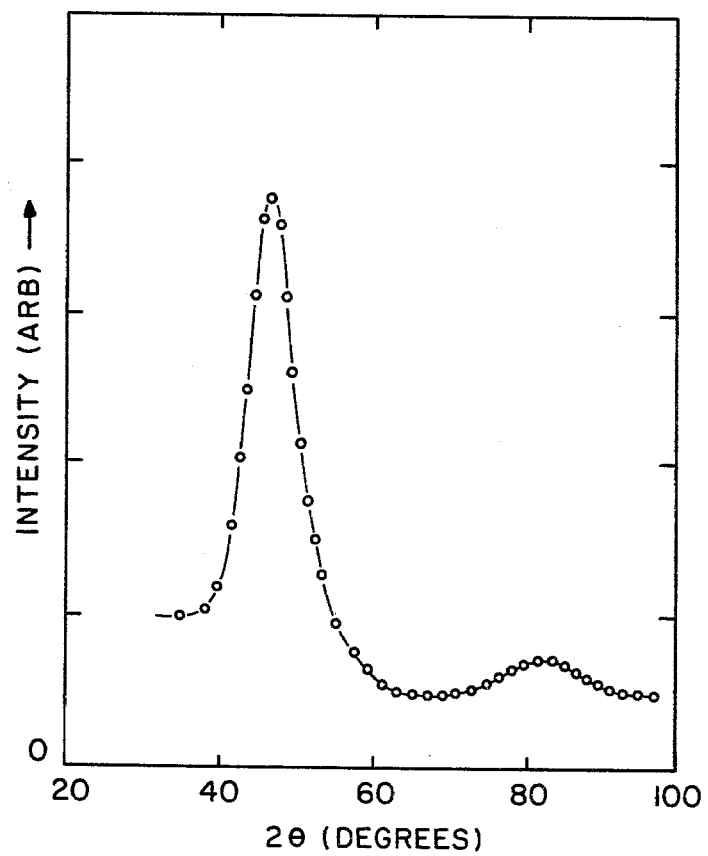

FIG. 1 is a schematic diagram of equipment for depositing an amorphous layer on a semiconductor substrate by RF sputtering; and FIG. 2 is a diffractometric scan of a typical amorphous Ni-Nb film embodying the features of this invention.

In the drawing, the substrate 10 is supported on an anode in the form of a platform 12 within a sealed vacuum chamber 14 which is backfilled with an inert gas, such as Argon, to a pressure suitable for sputtering as measured on a vacuum gauge 20. The composite cathode in the form of a plate 16 is spaced substantially parallel to the plate 12.

The RF sputtering voltage is sufficient to ionize the inert gas (Argon), causing a glow discharge 18 to form between the cathode 16 and the anode 12. Argon ions are attracted to the cathode where they in turn knock loose atoms of the cathode containing the metal or alloy to be deposited. The metal atoms, which are dislodged from the cathode, travel to the anode where some of them strike and adhere to the substrate 10. It may sometimes be desirable to circulate a cooling medium, such as water, through the substrate platform (anode) 12 to prevent a rise in the substrate temperature so that only amorphous metal films 22 will be deposited and retained on the substrate.

FIG. 2 shows a diffractometric scan of an amorphous Ni-Nb film having a thickness of $3\mu$ deposited by RF sputtering on an Si substrate. The signal-to-noise ratio was 4:1 for the lower peak.

The as-deposited films are amorphous, as revealed by the absence of any sharp crystalline X-ray diffraction peaks.

Amorphous Ni-Nb films have been deposited in the manner described on substrates of Si, GaAs, GaP, $SiO_2$, glass and $Al_2O_3$. In all cases, the films are hard, mirror-like and show outstanding adhesion to the substrates. In adhesion tests, the films have been found to be exceptionally difficult to scratch and cannot be pulled from the substrates with tape or epoxy-bonds.

The films appear to be extremely corrosion resistant. Films of approximately 1µ thickness are unaffected by 5-10 min. immersion in acid such as HCl or $HNO_3$ at room temperature. The same films can, however, be totally removed in ≲2 min. with a standard Nb-etch (7 HF-75 HCl-25 $HNO_3$).

Maximums of the sheet resistance of the films give values of 0.3–0.5Ω☐ for films of ~1µ thickness. Resistivities are thus in the 30–50 µΩ cm range.

It will be understood that various changes and modifications can be made in the above-described invention without departing from the spirit thereof, particularly as defined in the following claims.

We claim:

1. A semiconductor device for high temperature use comprising a semiconductor as a base and a layer strongly bonded to the surface of the base consisting essentially of an alloy in the amorphous non-crystalline state of a metal selected from the group consisting of a transition metal, transition metal/normal metal alloy, refractory metal and refractory metal/normal metal alloy, in which the amorphous metal layer has a crystallization temperature and stable microstructure at temperatures above 500° C., said amorphous metal layer being resistant to interdiffusion with the base.

2. A device as claimed in claim 1 in which the alloy is a multi-component alloy.

3. A device as claimed in claim 2 in which the alloy is a binary or a ternary alloy.

4. A device as claimed in claim 1 in which the alloy is selected from the group consisting of Ni-Mo, Ni-Nb, Mo-Si, W-Si and Ni-Ta.

5. A devie as claimed in claim 1 in which hafnium is included in the amorphous layer.

6. A device as claimed in claim 1 in which the base onto which the layer of amorphous alloy is bonded is a semiconductor or insulator.

7. A devie as claimed in claim 6 in which the base is selected from the group consisting of Si, GaAs, GaP, glass and $Al2O_3$.

8. A device as claimed in claim 1 in which the layer of amorphous metal is of a thickness within the range of 0.01 to 50 microns.

9. A device as claimed in claim 1 in which the amorphous metal alloy is deposited by atomic deposition onto the substrate base.

10. A device as claimed in claim 1 in which the amorphous metal alloy is deposited onto the semiconductor base by RF sputtering.

* * * * *